United States Patent [19]

Glaise

[11] Patent Number: 4,712,216
[45] Date of Patent: Dec. 8, 1987

[54] METHOD AND DEVICE FOR CORRECTING ERRORS IN MEMORIES

[75] Inventor: René J. Glaise, Nice, France

[73] Assignee: International Business Machines Corporation, Armonk, N.Y.

[21] Appl. No.: 789,195

[22] Filed: Oct. 18, 1985

[30] Foreign Application Priority Data

Dec. 28, 1984 [EP] European Pat. Off. ........ 84430046.7

[51] Int. Cl.$^4$ ............................................. G06F 11/10
[52] U.S. Cl. ........................................ 371/38; 371/39
[58] Field of Search ................... 371/37, 38, 39, 40

[56] References Cited

U.S. PATENT DOCUMENTS

| | | | |
|---|---|---|---|
| 3,623,155 | 11/1971 | Hsiao | 371/37 |
| 4,037,091 | 7/1977 | Beuscher | 371/38 |
| 4,175,692 | 11/1979 | Watanabe | 371/38 |
| 4,296,494 | 10/1981 | Ishikawa | 371/38 |
| 4,319,357 | 3/1982 | Bossen | 371/38 |
| 4,334,309 | 6/1982 | Bannon | 371/38 |
| 4,417,339 | 11/1983 | Cantarella | 371/38 |
| 4,604,751 | 8/1986 | Aichelmann | 371/38 |
| 4,608,692 | 8/1986 | Nagumo | 371/38 |

OTHER PUBLICATIONS

Kaufman, "Fault Tolerant Memory with Error Correcting Codes", IBM Tech. Disclosure Bulletin, vol. 26, No. 11, 4/84, pp. 142–144.
Evans, "Nelson Matrix Can Pin Down Two Errors Per Word", Electronics International, vol. 55, No. 11, 6/82, pp. 158–162.

Primary Examiner—Michael R. Fleming
Attorney, Agent, or Firm—William J. McGinnis, Jr.

[57] ABSTRACT

The bit configurations are arranged in M-bit code words, each word comprising a number D of data bits and an even number N of error correcting bits. The data bits are partitioned into N fields with an error correcting bit associated with each field to indicate the parity of the associated field. The assignment of data bits to the N fields in such that, when the N fields are used to generate an N-bit error syndrome, this syndrome will contain an odd number n1 of bits at a first value if there is a single bit in error, where N−n1=n2 is also odd, and an even number of bits different from N to indicate a two-bit error. The number of bits of the first value are then used to determine whether the codeword is in its true or inverted form.

8 Claims, 5 Drawing Figures

H MATRIX

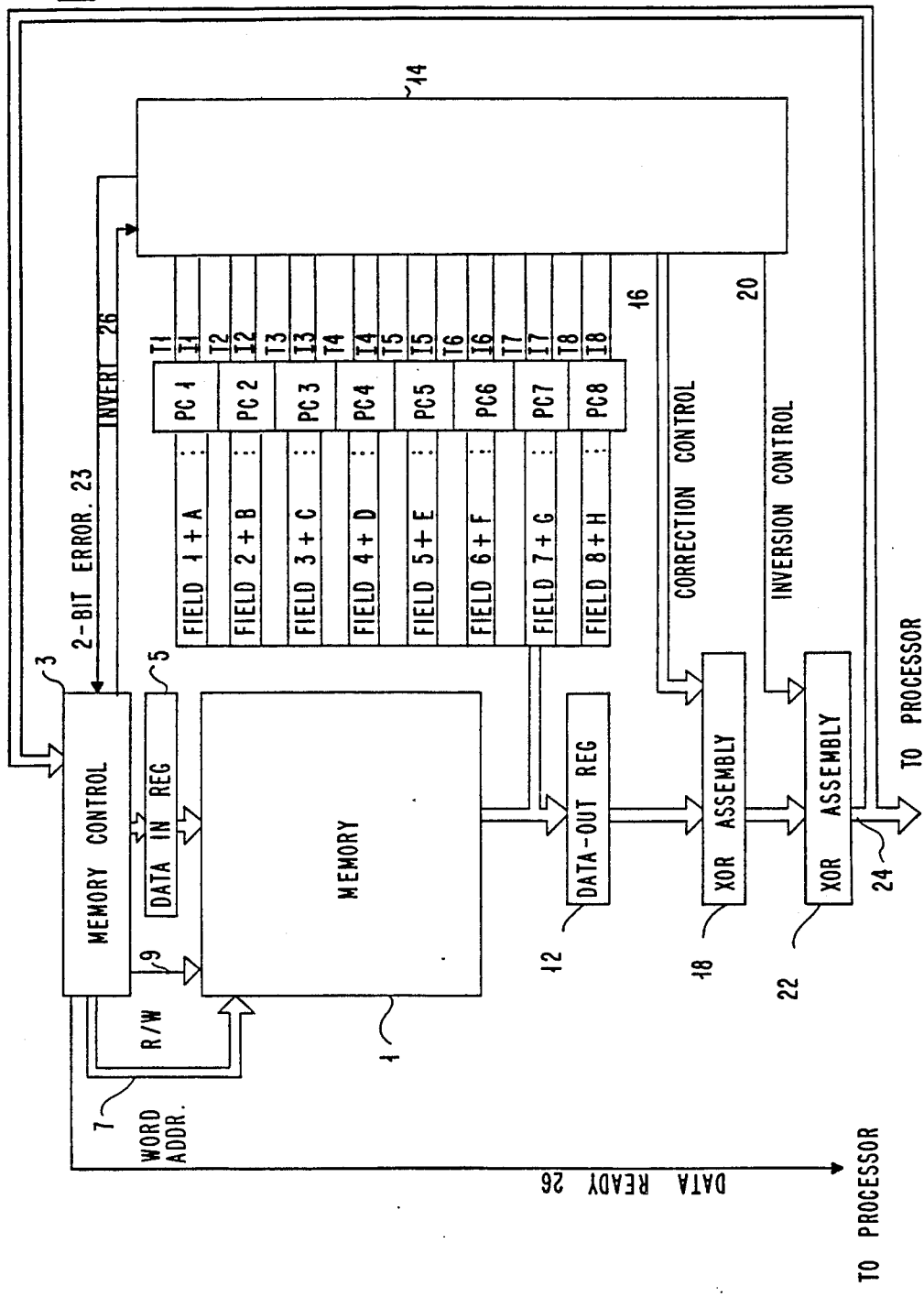

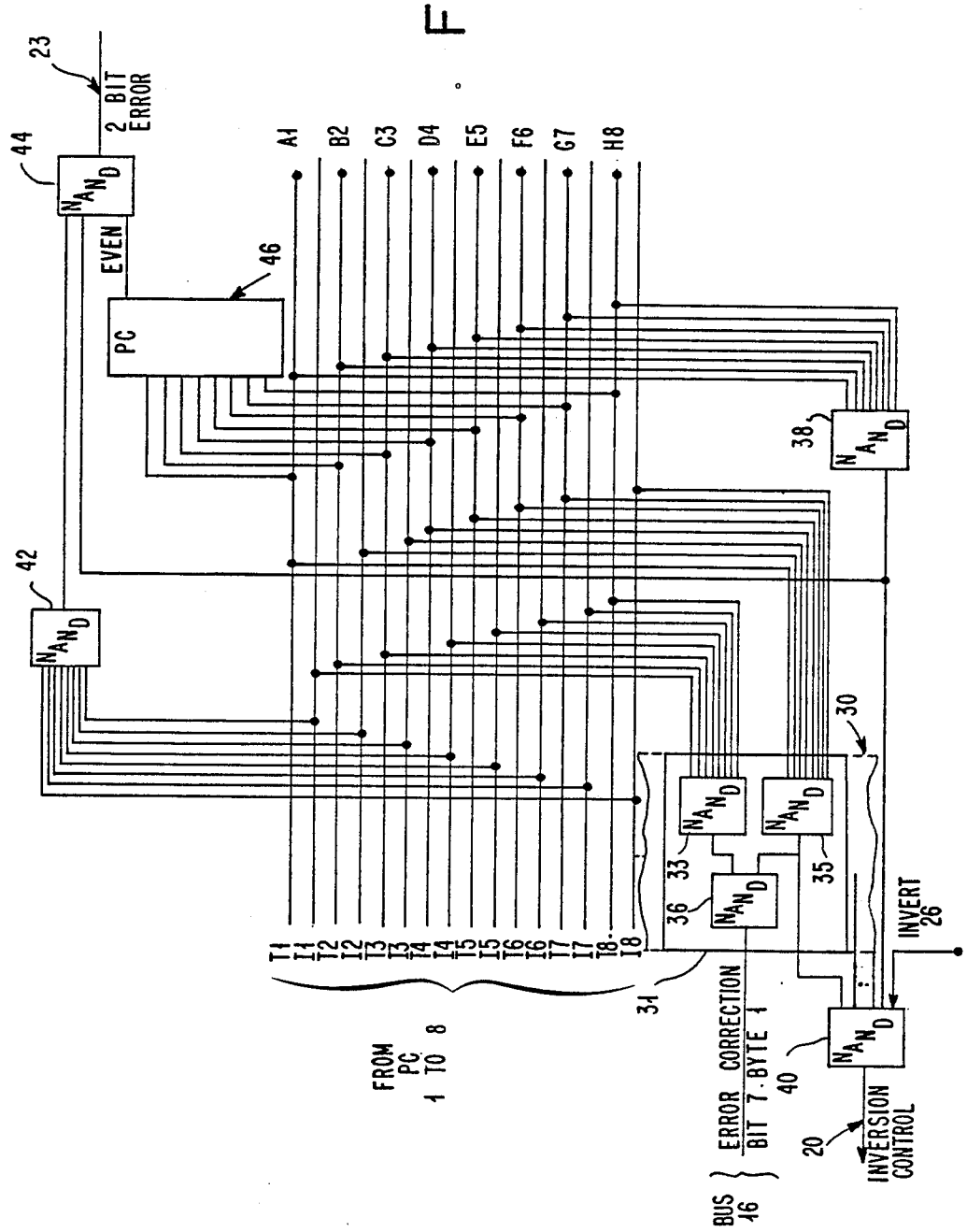

METHOD AND DEVICE FOR CORRECTING ERRORS IN MEMORIES

DESCRIPTION OF THE INVENTION

1. Field of the Invention

This invention relates to an error correction method and device for improving their failure rate.

2. Background Art

Correcting a single error and detecting double errors in stored bit configurations using Hamming codes are well known. See the article by M. Y. Hsiao, published in the IBM Journal Research and Development in July 1970, on pages 395 to 401. Also, see Hsiao, U.S. Pat. No. 3,623,155 where M bit code word comprise a number of data bits D and an even number of error correcting bits that are partitioned into N fields. The assignment of data bits to the N fields is such that when the fields are used to generate an N bit syndrome that syndrome will contain an odd number of binary "1"s if there is a single bit error in the code word. An article published in IEEE Transactions on information theory, Vol. IT-24, No 6, Nov. 1978, on pages 712 to 718 indicates that multiple errors may be masked by inversion of the stored bit configurations using an additional bit associated with each stored bit configuration to indicate whether that bit configuration is stored in its true or inverted form.

An object of the invention is to provide a substitute for this additional bit when using such inversion techniques in error correction.

Another object of this invention is to extend the correction capability of a simple distance 4 Hamming code normally capable of correcting all single bit errors and detecting all combinations of two-bit errors.

SUMMARY OF THE INVENTION

The bit configurations are arranged in M-bit code words, each word comprising a number D of data bits and an even number N of error correcting bits. The data bits are partitioned into N fields with an error correcting bit associated with each field to indicate the parity of the associated field. The assignment of data bits to the N fields is such that when the fields are used to generate an N-bit error syndrome, it contains an odd number n1 of bits at a first value if there is a single bit in error, where N−n1=n2 is also odd, and an even number of bits different from N to indicate a two-bit error. The number of bits of the first value in the syndrome are then used in place of the prior art additional bit to determine whether the codeword is in its true or inverted.

BRIEF DESCRIPTION OF THE DRAWINGS

FIGS. 2 and 3 represent the flow diagrams of the write and read operations performed according to the method of the invention.

FIG. 4 represents the device which implements the method according to the invention.

FIG. 5 represents in details the logic circuit 14 of FIG. 2.

DETAILED DESCRIPTION OF THE INVENTION

Figure 1:
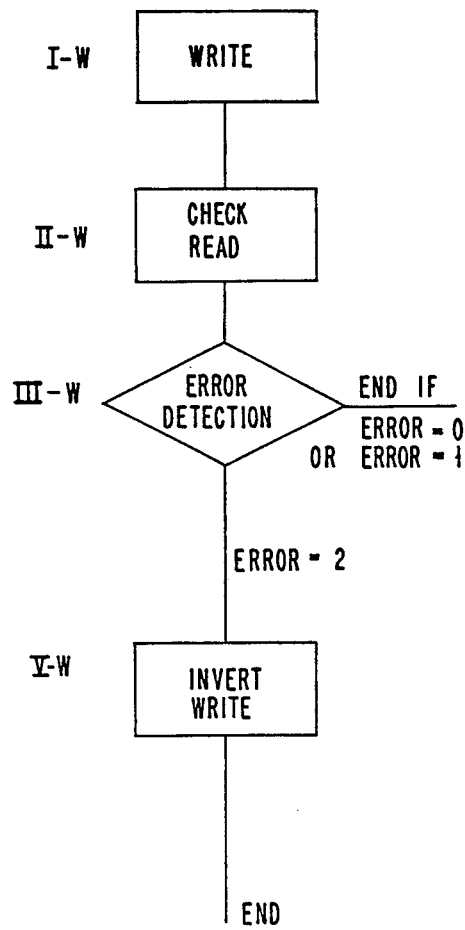
FIG. 1 represents a Hamming coding matrix which can be used for implementing the method according to the invention.
Figure 1:
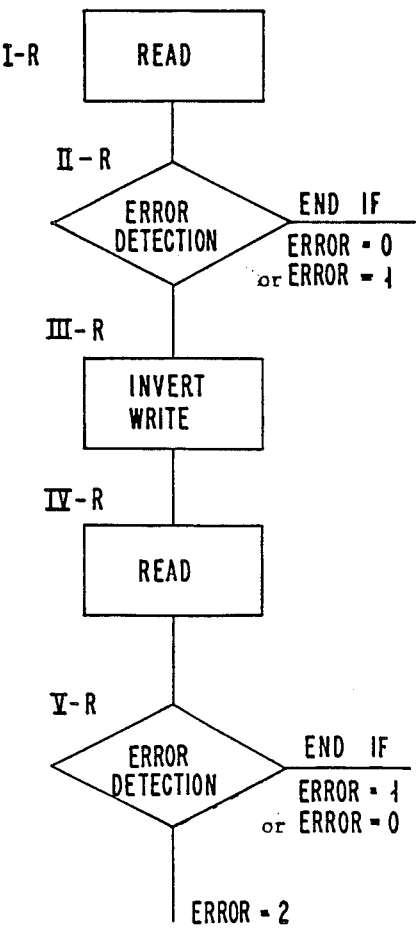

The code which is used in a preferred embodiment of the invention is shown in FIG. 1, assuming that the M-bit words stored in the memory contain D data-bits, i.e. four eight-bit bytes. These bits are partitioned into eight fields of twelve bits, and the parity of each field is generated to provide eight error correcting code ECC bits, A, B, C, D, E, F, G, H. For example ECC bit A represents the parity of the first field, bit B represents the parity of the second field, and so on ... M is thus equal to 40 and D to 32.

In a preferred embodiment of the present invention, it is assumed that an odd parity is used which means that, once encoded each field including the associated ECC bit contains an odd number of ones or active levels.

An advantageous characteristic of this code is that it is not transparent, thus once encoded and inverted a 40-bit word provides an inverted error syndrome. The error syndrome is the eight bit configuration A1, B2, C3, D4, E5, F6, G7, H8 which is generated after reading of a word by checking the ECC bits against the corresponding data field. In case all the ECC bits are correct an all 0's syndrome is generated. An error syndrome with three bits at 1 indicates that the word comprises a single bit error. For example an error syndrome with bits A1, B2 and E5 at "1" indicates that bit 4 of byte 2 is erroneous. An error syndrome with an even number 2, 4 or 6 bits at 1 indicates that the word comprises a two-bit error. As can be seen in the following table I, all the syndromes given by the 780 possible combinations of 2-bit errors within the 40-bit word contains an even number of bits at "1", however the case where eight bits are erroneous is never encountered and only 2, 4 and 6 bit combinations occur. Table I represents the syndromes generated by the 780 combinations of two-bit errors within a 40-bit word and the number of occurrences of each syndrome.

TABLE I

| Number of oc-currences | 2 bit error syndrome | Number of oc-currences | 2-bit error syndrome | Number of oc-currences | 2-bit error syndrome |
|---|---|---|---|---|---|
| 9 | ......11 | 9 | .....1.1 | 13 | ......11. |
| 13 | ....1..1 | 9 | ....1.1. | 9 | ....11.. |
| 8 | ....1111 | 9 | ...1..1 | 9 | ...1..1. |
| 9 | ...1.1.. | 6 | ...1.111 | 9 | ...11... |
| 6 | ...11.11 | 6 | ...111.1 | 6 | ...1111. |
| 9 | ..1.....1 | 9 | ..1..1. | 9 | ..1..1.. |
| 6 | ..1..111 | 9 | ..1.1... | 6 | ..1.1.11 |
| 6 | ..1.11.1 | 6 | ..1.111. | 9 | ..11..... |
| 4 | ..11..11 | 4 | ..11.1.1 | 6 | ..11.11. |
| 6 | ..111..1 | 4 | ..111.1. | 4 | ..1111.. |
| 4 | ..111111 | 9 | .1......1 | 9 | .1....1. |
| 9 | .1...1.. | 6 | .1...111 | 9 | .1..1... |
| 6 | .1..1.11 | 6 | .1..11.1 | 6 | .1..111. |
| 13 | .1.1.... | 6 | .1.1..11 | 6 | .1.1.1.1 |
| 8 | .1.1.11. | 8 | .1.11..1 | 6 | .1.11.1. |
| 6 | .1.111.. | 4 | .1.11111 | 9 | .11...... |
| 4 | .11...11 | 4 | .11..1.1 | 6 | .11...11. |
| 6 | .11.1..1 | 4 | .11.1.1. | 4 | .11.11.. |
| 4 | .11.1111 | 6 | .111...1 | 6 | .111..1. |
| 6 | .111.1.. | 4 | .111.111 | 6 | .1111... |
| 4 | .1111.11 | 4 | .11111.1 | 4 | .111111. |
| 9 | 1......1 | 9 | 1.....1. | 9 | 1....1.. |
| 6 | 1....111 | 9 | 1...1... | 6 | 1...1.11 |
| 6 | 1...11.1 | 6 | 1...111. | 9 | 1..1..... |
| 4 | 1..1..11 | 4 | 1..1.1.1 | 6 | 1..1.11. |
| 6 | 1..11..1 | 4 | 1..11.1. | 4 | 1..111.. |
| 4 | 1..11111 | 13 | 1.1..... | 6 | 1.1....11 |
| 6 | 1.1..1.1 | 8 | 1.1..11. | 8 | 1.1.1..1 |
| 6 | 1.1.1.1. | 6 | 1.1.11.. | 4 | 1.1.1111 |
| 6 | 1.11.... | 6 | 1.11..1. | 6 | 1.11.1.. |
| 4 | 1.11.111 | 6 | 1.111... | 4 | 1.1111.1 |
| 4 | 1.1111.1 | 9 | 11...... | 4 | 11....11 |
| 4 | 11....111 | 4 | 11...1.1 | 6 | 11...11. |
| 6 | 11..1..1 | 4 | 11..1.1. | 4 | 11..11.. |
| 6 | 11.1.1.. | 4 | 11.1.111 | 6 | 11.11... |
| 6 | 11.1.1.. | 4 | 11.1.1.1 | 4 | 11.11... |
| 6 | 11..1111 | 4 | 11.1...1 | 6 | 11.1..1. |
| 6 | 11.1.1.. | 4 | 11.1.1.1 | 4 | 11.11... |
| 6 | 11.1.1.. | 4 | 11.1.111 | 6 | 11.11... |

TABLE I-continued

| Number of occurrences | 2 bit error syndrome | Number of occurrences | 2-bit error syndrome | Number of occurrences | 2-bit error syndrome |
|---|---|---|---|---|---|
| 4 | 11.11.11 | 4 | 11.111.1 | 4 | 11.1111. |
| 6 | 111....1 | 6 | 111...1. | 6 | 111..1.. |
| 4 | 111..111 | 6 | 111.1... | 4 | 111.1.11 |
| 4 | 111.11.1 | 4 | 111.111. | 8 | 1111.... |
| 4 | 1111..11 | 4 | 1111.1.1 | 4 | 1111.11. |
| 4 | 11111..1 | 4 | 11111.1. | 4 | 111111.. |
| 0 | 11111111 | | | | |

As seen in the table, and as stated above, the case where eight bits are "1" is never used.

Inversion of a twelve-bit field associated with its ECC bit such as:

$$0\ 0\ 0\ 1\ 0\ 1\ 0\ 1\ 0\ 0\ 0\ 1 \quad 1 \longleftarrow \text{Parity bit}$$

gives the following configuration:

$$1\ 1\ 1\ 0\ 1\ 0\ 1\ 0\ 1\ 1\ 1\ 0 \quad 0 \longleftarrow \text{Bad parity}$$

Consequently, after inversion, a single bit error is indicated by an error syndrome having five bits at one instead of three.

The error syndrome which is generated when a word is read from the memory indicates whether the word is stored with its true or inverted polarity and is used to detect and correct the bit in error as follows:

An all 0's syndrome indicates that the word is correct and stored with its true polarity.

An all 1's syndrome indicates that the word is correct and stored with its inverted polarity.

A syndrome with three bits at 1 indicates that the word was stored with its true polarity and contains a one bit error, the position of which is detected so that the bit can be corrected by inversion.

A syndrome with five bits at 1 indicates that the word was stored with its inverted polarity and contains a one-bit error, the position of which is detected so that the bit can be corrected by inversion.

A syndrome with an even number of bits at 1, said number being different of N or 0 indicates a two-bit error which cannot be corrected. The inversion of a word containing a two-bit error may in given conditions, causes two hard errors to be masked. This can be demonstrated by assuming that two memory positions in the word are stuck at 0 or 1.

| Memory positions | | |
|---|---|---|
| stuck at zero | ⟶ 0 0 | |
| pattern to be stored | ⟶ 0 0 NO ERROR: | the pattern matches the hard clamps |
| pattern to be stored | ⟶ 0 1 1 BIT ERROR: | one bit of the pattern matches the hard clamps |
| pattern to be stored | ⟶ 1 0 1 BIT ERROR: | one bit of the pattern matches the hard clamps |
| pattern to be stored | ⟶ 1 1 2 BIT ERROR: | none of the bits matches the hard clamps |

This scheme is similar when two memory positions are stuck at "11" or "01" or "10".

Whenever the last case is encountered, the pattern is stored with its inverted polarity and the two-bit error is masked for this particular word so long as the address content is not updated.

FIG. 2 represents the flow diagram of a write operation which comprises the following steps:

Step I-W: the data bits with their associated ECC bits are stored in the addressed word, Step II-W: a read check is performed which consists in reading back the written pattern from the addressed word, Step II-W: the error syndrome is analyzed and the operation is terminated if there is no error or a single bit error, Step IV-W: this step is entered, if a two-bit error is detected. The inverted pattern is written in the addressed word so that in that memory word position, the word will be stored with its inverted polarity as long as no operation is performed upon it.

FIG. 3 represents the flow diagram of a read operation which comprises the following steps:

Step I-R: the addressed word is read from the memory,

Step II-R: the error syndrome is generated and checked. If it indicates a single bit error, the erroneous bit is corrected and the corrected word is sent to the machine (such as a data processor) incorporating the memory, inverted or not depending whether the error syndrome indicates that the word was stored with its inverted or true polarity. If the syndrome error indicates no error the read word is sent to the processor inverted or not depending on whether the error syndrome indicates that the word is stored with its inverted or true polarity.

Step III-R: this step is entered if a two-bit error is detected: the read word is re-written in the memory with an inverted polarity. This occurs when:
- a second hard error has occurred since the last encoding,
- a soft error has occurred when an unmasked hard error was present,
- two hard errors have occurred since last encoding.

Step IV-R: the thus inverted word is read,

Step V-R: the error syndrome of the word read during step IV-R is generated and checked.

If it indicates a single-bit error, the erroneous bit is corrected and the corrected word is sent to the machine (such as a data processor) incorporating the memory, inverted or not depending whether the error syndrome indicated that the word was stored with its inverted or true polarity. If the syndrome error indicates no error the read word is sent to the processor inverted or not depending on whether the error syndrome indicates that the word is stored with its inverted or true polarity.

If it still indicates a two-bit error, an uncorrectable error condition is encountered. The error correction process fails.

This occurs when there have been two hard errors, one being masked and a soft error which has occured since the last encoding. After inversion there are still two errors.

Consequently, the method according to the invention has the following capability:
a single hard error is always corrected,
two hard errors are always corrected,
one hard error aligned with one soft error is always corrected,
one soft error is always corrected,
fifty per cent of the error conditions which consist of two hard error aligned with one soft error are corrected,
two soft errors are never corrected.

A scrubbing routine to clean the soft errors should be run under the control of the processor while memory is in standby. Because the words are not recomplemented the soft errors are not eliminated although the correct pattern is delivered to the processor.

The method can be extended to the correction and detection of words of any bit length provided the code rules are met: namely the error syndrome contains a even number N of bits which is such that:
the word fields which are considered to generate the ECC bits contain also an even number of bits,
a single condition in a word stored with its true polarity is indicated by a first number n1 of bits at a first value (which is "1" in the preferred embodiment of the invention) and by a second number n2 of bits at said first value with n1+n2=N, n1 and n2 being different and are both odd numbers and
a two-bit condition in a word stored with its true or inverted polarity is indicated by an error syndrome which contains a number of bits at the first value which is even, said number being different from N and zero.

FIG. 4 represents the block diagram of the error correction and detection mechanism which is used for implementing the method according to the present invention. Read/Write memory 1 cna be written or read at word positions selected through memory control circuit 3 and data-in register 5. Memory control circuit provides the word address on bus 7 and the read or write commands on line 9 in order to write a selected words into the memory or to cause the content of the selected word to be read and transferred in data-out register 12. This arrangement, which is conventional, is not shown in details.

The error correction and detection circuit comprises eight parity checkers PC1 to PC8, each receiving one data bit field 1 to 8 and the associated ECC bits A to H respectively. The parity checkers generate on their true output T a signal which, in a preferred embodiment, is at a "0" level when the parity of the checked bits is correct. The inverted level is generated on the complement outputs I of the parity checkers. Inversely, when the parity is not correct, the parity checkers generate a "1" level on their true outputs and a "0" level on their complement outputs. Thus the error syndrome is generated on the true outputs of the parity checkers.

Logic circuit 14 receives the true and complement outputs of the parity checkers PC1 to PC8. It generates the correction control signals on its output bus 16, there is one correction control signal for each bit of the read word. When a one-bit error is detected, i.e. when three bits or five bits of the error syndrome are at one, depending upon the polarity of the stored word, the correction control signal is activated on one wire of bus 16, so as to correct the bit in error which is indicated by the three or five bits at "1" in the error syndrome in accordance with the coding matrix shown in FIG. 1.

The read word contained in the data-out register 12 is provided to an assembly 18 of XOR circuits. Each XOR circuit in this assembly receives on its first input, one bit of the 40-bit word and on its second input, the correction control signal provided on the wire of bus 16 dedicated to the correction of the bit applied to the first input. When the error correction signal on the second input of XOR circuit is active (UP level), the level of the output signal of this XOR circuit is the inverse of the level of the signal on its first input. Consequently, when a one-bit error is detected, the outputs of XOR circuit assembly 18 provide the corrected read word.

Logic circuit 14 provides an inversion control signal on line 20. This signal is set to its active level (UP level), when the addressed position contains the inverted value of the word. The outputs of XOR circuit assembly 18 are provided to the first inputs of XOR circuits in second XOR circuit assembly 22 and the inversion control signal is provided on their second inputs so as to cause the inversion of the read word when the error syndrome contains five or eight "1"s. The outputs of XOR assembly 22 are transmitted by means of bus 24 to the word processing unit to be used as the correct read word when data ready line 26 from memory control circuit 3 is active, i.e. when no two-bit error condition has been reported to circuit 3 through line 23. The outputs of assembly 22 is also applied to memory control circuit 3 so as to cause the inverted bit pattern to be re-written in the memory to perform step III-W or step III-R as described in reference to FIGS. 2 and 3.

Logic circuit 14 provides on line 23 a signal indicating that a two-bit error is detected, which is at its active level when the error syndrome contains an even number 2, 4 or 6 of bits at "1". The two-bit error indication signal is provided to memory control circuit 3 so as to cause the corresponding memory positions to be re-written with the inverted bit values or to indicate that the error correction fails.

FIG. 5 represents a specific logic circuit 14 which can be used in a preferred embodiment. The error syndrome bits A1, B2, C3, D4, E5, F6, G7, H8 which are generated from the fields 1 to 8 including the ECC bits A to H respectively are provided on the true outputs T1 to T8 of the parity checkers and their complements are provided on the complement outputs I1 to I8.

An asembly 30 of forty NAND gate arrangements such as 31 is connected adequately to specific true and complement outputs T1 to T8 and I1 to I8 to generate the correction control signals on the wires of bus 16. Only arrangement 31 in assembly 30 which allows the generation of the correction control signal of bit 7 in byte 1 is shown. The other arrangements are similar but are connected to the adequate outputs of the parity checkers PC1 to PC8 so as to generate the error syndrome bits in accordance with the coding matrix shown in FIG. 1.

Each arrangement 31 includes three NAND gates 33, 35 and 36.

NAND gate 33 is connected to outputs I1, T2, T3, I4, I5, I6, I7, and T8. Consequently, when the word is stored with its true polarity and when the bit 7 in the byte 1 is in error, the level of the signal at the output of NAND gate 33 is at its DOWN level. If bit 7 in byte 1 is correct as the other bits in the word the output of NAND gate 33 is at its UP level. If there is more than one bit in error, the output of NAND gate 33 is also at its UP level. When the word is stored with its inverted polarity, the output of NAND gate 33 is at its UP level in all cases.

NAND gate 35 is connected to outputs T1, I2, I3, T4, T5, T6, T7 and I8 of parity checkers PC1 to PC8. Consequently when the word is stored with its inverted polarity and when the bit 7 in the byte 1 is in error, the level of the signal at the output of NAND gate 35 is at its DOWN level. If bit 7 in byte 1 is correct as the other bits in the word the output of NAND gate 35 is at its UP level. If there is more than one bit in error, the output of NAND gate 35 is also at its UP level. When the word is stored with its true polarity, the output of NAND gate 35 is at its UP level in all cases.

The outputs of NAND gates 33 and 35 are connected to NAND gate 36 which generates on its output the control inversion signal which is at its active UP level when bit 7 of byte 1 is in error. In all other cases, this signal is at its inactive DOWN level.

NAND gate 38 is connected to outputs T1, T2, T3, T4, T5, T6, T7 and T8 of parity checkers, consequently when the syndrome error is all 1's which means that the read word is to be inverted, the output level of this gate is at its DOWN level.

The inputs of NAND gate 40 are connected to the outputs of NAND gates 35 in each circuit of assembly 30, to the output of NAND gate 38 and to the invert control line 26 from memory control circuit 3, so as to generate the inversion control signal on its output. This signal is at its UP level when the levels on the outputs of NAND gates 38 and 35 are DOWN to control the inversion of the word sent to the processor by means of XOR assembly 22. Invert control line 26 is active at its down level to cause the read pattern to be inverted by assembly 22 and transmitted to circuit 3 to be re-written in the memory for performing step III-W or step III-R during a write or a read operation as described in reference to FIGS. 2 and 3.

The two-bit error condition is generated through NAND gates 38, 42 and 44 and parity checker PC 46. The inputs of NAND gate 42 are connected to the complement outputs I1 to I8 of parity checkers PC1 to PC8. Thus, when the syndrome error is all 0's the output of NAND gate 42 is at its DOWN level and when it contains at least one "1" bit, it is at its UP level.

Parity checker PC 46 generates an output signal which is at the UP level when the error syndrome contains an even number of bits at "1". The inputs of NAND gate 44 are connected to the outputs of NAND gates 42 and 38 and to the output of parity checker 46. Thus NAND gate 44 generates an output signal which is at its active DOWN level when the following conditions are met:
  there is an even number of bits at "1" in the error syndrome,
  the number of bits at "0" is different from eight,
  the number of bits at "1" is different from eight.

Above conditions 2 and 3 are indicative that there is no error.

The two-bit error condition is reported to the memory control device 3 on line 23 to be used for indicating either that the error correction process fails or to control the re-writing of the word with its inverted polarity by activating invert line 26. When the error correction process fails, data ready line 26 in FIG. 4 is made inactive, so that the processor does not take the data bits provided thereto into account.

Having thus described my invention, what I claim as new and desire to secure by Letters Patent is:

1. Method for correcting errors in memories wherein the stored bits which may have a first or a second value ("1" or "0") are arranged in M-bit words, each word comprising an integer number D of data bits and an even integer number N of error correcting bits, with $D+N=M$, the data bits being partitioned into N fields comprising an even number of bits in such a way that an error correcting bit is associated to each field to indicate the parity of the associated field, the N fields with their associated error correction bits being used when a word is read from the memory to generate an N-bit error syndrome which contains an integer number n1 of bits at a first value ("138 ) to indicate a single bit in error, said number n1 being odd and such that $N-n1=n2$ is odd, and is different from n1 and an even number of bits at the first value ("1") different from N or 0 to indicate a two-bit error, said method being characterized in that:
  in read mode, each word is read from the memory by performing the following steps:
    reading the addressed word,
    generating the error syndrome,
    ending the reading operation if the error syndrome indicates that the read word contains no error or a single-bit error in which case if the error syndrome contains no bit at the first value ("1") meaning that there is no bit in error, the read word is ready to be used, if the error syndrome contains N bits at the first value ,
  meaning that the word is stored in the inverted form and contains no bits in error, the read word is inverted before being delivered to the machine using the word, if the error syndrome contains n1 bits at the first value, the bit in error in the word is corrected and the corrected word is delivered to the machine, and if it contains n2 bits at the first value, which means that the word is stored in the inverted form and contains a single bit error, the bit in error is corrected and the read word is inverted before being delivered to the machine,
    re-writing the inverted word if the error syndrome indicates a two-bit error,
    reading the inverted word and generating the error syndrome of the inverted word,
    reporting an uncorrectable error condition if the error syndrome of the inverted word indicates a two-bit error, or
    ending the reading operation if the error syndrome of the inverted word contains no error or a single-bit error, in which case if the error syndrome contains no bit at the first value ("1") the read word is ready to be used, if the error syndrome contains N bits at the first value the read word is inverted before being delivered to the machine using the word, if the error syndrome contains n1 bits at the first value, the bit in error in the word is corrected and the corrected word is delivered to the machine, and if it contains n2 bits at the first value, the bit in error is corrected and the read word is inverted before being delivered to the machine.

2. Method according to claim 1 characterized in that in write mode, each word is written by performing the following steps:
  writing the word in the memory at the selected address, performing a read check operation which consists in reading the word, generating the error syndrome of the read word, re-writing the word with an inverted polarity, if the error syndrome indicates a two-bit error and terminating the writing operation if the error syndrome indicates no error or a single-bit error.

3. Device for implementing the method according to any one of claims 1 or 2 in a memory arrangement including a memory control circuit (3) for providing the memory with read, write and address signals and with the words to be written at addressed locations and N parity checkers (PC1 to PC6) each one receiving one field of a read word and the associated error correction bit (A to H) for generating therefrom the error syndrome and its complement, said device being characterized in that it comprises:

a logic circuit (14) receiving the error syndrome bits and their complements from the parity checkers for generating:

N+D correction control signals on its output bus (16), one signal among the N+D signals being active when the error syndrome contains an odd number n1 or n2 of bits at the first value.

an inversion control signal on a first output line (20), said signal being active when the error syndrome contains n2 or N bits at the first value or when an invert signal is provided from the memory control circuit (3) to cause the inverted read word to be re-written in the memory a two-bit error indicating signal on a second output line (23) said signal being active when the error syndrome contains an even number of bits at the first value, said number being different from N and 0, N+D first inversion means (18) each one receiving one bit of the read word and one of the correction control signals so as to cause the received bit to be inverted if the correction control signal is active, N+D second inversion means (22) each one receiving the output signal of one of the first inversion means (18) and the inversion control signal so as to cause the read word on the outputs of the first inversion means to be inverted when this signal is active, the signals on the outputs of said second inversion means representing the corrected read word which can be used in the machine incorporating the memory arrangement when the read operation is ended and that no uncorrectable two-bit error condition is reported on second output line (23).

4. Device according to claim 3 characterized in that the first inversion means are XOR circuit.

5. Device according to claim 3 or 4 characterized in that the second inversion means are XOR circuits.

6. Device according to claim 3 characterized in that the logic circuit comprises first means (30) for generating the N+D correction signals said means comprising N+D NAND gate arrangements (31), each arrangement generating on its output an error correction signal which is active for controlling the correction of a specific bit of the read word and comprising a first NAND gate which receives the n2 complement bits of the error syndrome which are at the first value when the specific bit is in error and the true n1 bits which are at the first value when the specific bit is in error and a second NAND gate (35) which receive the n2 true bits of the error syndrome which are at the first value when the specific bit is in error and the read word was inverted and the n1 complement bits of the error syndrome which are at the n1 complement bits of the error syndrome which are at the first value when the specific bit is in error and the read word was inverted and a third NAND gate (36) which is connected to the output of first and second NAND gates and which generate on its output the correction control signal for the specific bit.

7. Device according to claim 6 characterized in that the logic circuit comprises second means (38, 40) for generating the inversion control signal, said means comprising a first NAND gate (38) connected to the true outputs of the parity checkers (PC1 to PC8) and a second NAND gate (40) which is connected to the second NAND gate outputs of the NAND gate arrangements in the first means and to the output of the first NAND gate in the said second means and to the invert line (26) from the memory control circuit (3).

8. Device according to claim 7, characterized in that the logic circuit comprises third means (38, 42, 44, 46) for generating the two-bit error indicating signal on second output line (23) of said logic circuit, said third means comprising a parity checker (PC 46) which is connected to the true outputs of the parity checkers (PC1 to PC8) generating the syndrome error, a first NAND (42) which is connected to the complement outputs of said parity checkers (PC1 to PC8), and a second NAND gate (44) which is connected to the output of the first NAND (38) in the second means, to the output of the parity checker in said third means and to the output of the first NAND gate (42) in said third means, said second NAND gate generating the two-bit error indicating signal.

* * * * *